United States Patent [19]

Ayres

[11] Patent Number: 4,751,455

[45] Date of Patent: Jun. 14, 1988

[54] LOW FREQUENCY NOISE MEASUREMENT SYSTEM USING SLIDING POLE FOR FAST SETTLING

[75] Inventor: Charles H. Ayres, Plaistow, N.H.

[73] Assignee: Analog Devices, Inc., Norwood, Mass.

[21] Appl. No.: 804,286

[22] Filed: Dec. 4, 1985

[51] Int. Cl.⁴ .............................................. G01R 27/00
[52] U.S. Cl. .................... 324/57 N; 307/520; 330/2
[58] Field of Search ............. 324/57 R, 57 N, 158 R, 324/158 D, 158 T; 307/520, 521; 328/167; 330/2

[56] References Cited

U.S. PATENT DOCUMENTS

| | | | |
|---|---|---|---|
| 3,541,462 | 11/1970 | Sarkisian et al. | 330/11 |
| 3,619,780 | 11/1971 | Hoeks et al. | 324/158 T |
| 3,832,642 | 8/1974 | Helgeland | 330/2 |
| 3,842,346 | 10/1974 | Bobbitt | 324/73 R |
| 3,863,165 | 1/1975 | Egawa et al. | 330/2 |
| 4,045,733 | 8/1977 | Dolan et al. | 324/140 R |
| 4,114,096 | 9/1978 | Chinery | 324/158 D |
| 4,460,868 | 7/1984 | Schmitt et al. | 324/158 F |
| 4,604,572 | 8/1986 | Horiuchi et al. | 324/158 F |
| 4,659,996 | 4/1987 | Nadir | 328/167 |

*Primary Examiner*—Reinhard J. Eisenzopf
*Assistant Examiner*—Walter E. Snow
*Attorney, Agent, or Firm*—Wolf, Greenfield & Sacks

[57] ABSTRACT

Apparatus and method for performing low-frequency noise measurements on active devices such as operational amplifiers, instrumentation amplifiers and the like. A device under test is settled thermally in a short, controlled interval. The device under test is placed in a test fixture within a closed housing which shields against air flow. A substantial heat sink is urged against the device under test while a pre-heat circuit preheats the device for about 1-2 seconds by forcing it to consume a predetermined amount of energy. The voltage output of the device under test is supplied to a band-pass filter which includes a high-pass filter having a single dominant pole whose frequency may be varied. A control circuit smoothly moves that pole from a first, higher frequency of about 50 Hz to a second, lower frequency of about 0.1 Hz in an interval of only 3 seconds or so, rapidly settling the filter.

12 Claims, 11 Drawing Sheets

BASIC FILTER SETTLING CIRCUIT

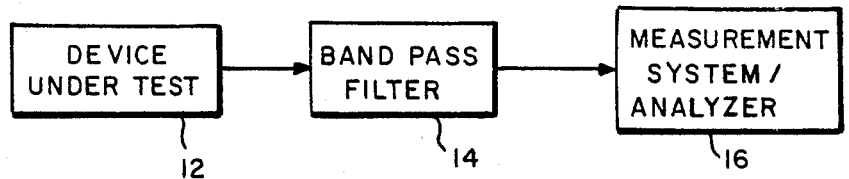
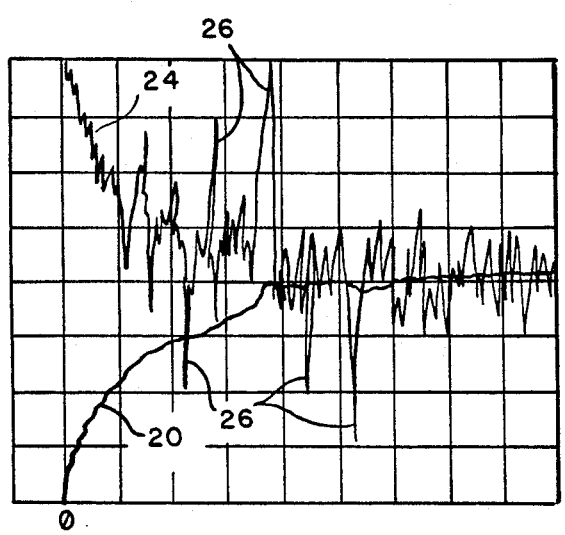

CURVE 100: FILTER OUTPUT
CURVE 102: SIGNAL INPUT
HORIZ. = 1 SEC./DIV.

CURVE 104: FILTER OUTPUT
CURVE 102: SIGNAL INPUT
HORIZ. = 1 SEC./DIV.

CURVE 106: FILTER OUTPUT
CURVE 102: INPUT SIGNAL
HORIZ. = 1 SEC./DIV.

VOLTAGE CONTROLLED
RESISTOR CHARACTERISTIC

VERT. = 2mA. / DIV
HORIZ. = IV. / DIV.
CONTROL VOLTAGE = -1.40 V.D.C.

FIG. 16 — BASIC FILTER SETTLING CIRCUIT

LOW FREQUENCY NOISE MEASUREMENT SYSTEM USING SLIDING POLE FOR FAST SETTLING

FIELD OF THE INVENTION

This invention relates to the field of noise measurement, and, more particularly, to the measurement of voltage noise generated by an operational amplifier in the low frequency range of, for example, 0.1 Hz to 10 Hz.

BACKGROUND OF THE INVENTION

For a variety of applications, amplifiers are required which generate very low levels of noise at low frequencies (e.g., below about 100 Hz). For example, in a system for measuring or processing low frequency data signals, the internal generation of low frequency noise within the system can cause false measurements on or processing of the data signals (so that in the extreme, for example, the system ends up measuring its own noise, instead of the data signals). The generation of low frequency noise is therefore a matter of concern in the design and production of certain types of measurement systems. Often, such measurement, sensing or signal processing systems employ active circuits such as operational amplifiers to filter and amplify low-level, low frequency signals generated by appropriate sources, such as transducers. Operational amplifiers and other elements intended for use in such applications are therefore tested (frequently, during the manufacturing process), to measure the voltage noise generated by the element itself. These measurements are frequently made over a range of about 0.1 to 10 Hz.

In a production environment, it is desirable to be able to make such noise measurments as quickly as possible, to maximize the use of the resources devoted to testing as well as the production rate. The thermal settling characteristics of the device under test ("DUT"), however, and the settling characteristics of the filter which shapes the input pass-band of the measurement system place limitations on the speed with which such noise measurements can be made. That is, when the device under test is energized after having achieved an ambient temperature, it will gradually warm up as it draws current. This gradual warm up, causes a corresponding gradual change in the output voltage of the DUT even when its input is static. This change in output voltage, sometimes referred to as thermal drift, is differentiated in the filter, thereby generating a signal which may be considered self-generated thermal noise. This thermal noise can "swamp" (i.e., dominate) the steady state noise characteristic of the DUT. For example, the "chip" temperature of the model AD544 operational amplifier manufactured by Analog Devices, Inc. of Norwood, Mass., changes about 10 degrees Celsius during a five minute warm-up period. This produces output equivalent to that which would result from an input offset variation of about 200 microvolts during this time. Consequently, if the expected steady-state noise voltage to be measured is only about two microvolts peak-to-peak, such an input offset change due to temperature can cause any noise measurement made during warm-up to be totally meaningless. According to the prior art, therefore, after energizing the device under test, it is necessary to wait for the temperature of the DUT to stabilize before noise measurements are taken. This may, when a typical operational amplifier constitutes the DUT, require as mush as 8 minutes. And if the DUT is left in open air, the equivalent offset voltage may never settle, because the air temperature is never constant.

Some improvement is obtained by putting a cover over the device under test. Experimentation has shown that the warm-up drift will then have a more predictable characteristic. The total offset change may be a little more than it would have been with no cover over the DUT, but that offset settles out to a very stable point. This approach can thus allow an accurate measurement of the noise generated by the device under the test; however, the time required before a noise measurement can be taken reliably is still about 4 minutes, for a typical operational amplifier. Moreover, if the temperature of the DUT starts off from the body temperature of the person inserting it into the test apparatus, there is added uncertainty as to the time required for the thermal settling.

SUMMARY OF THE INVENTION

These problems are overcome in the present invention by (1) placing the device under test in a test fixture which shields against air flow, forces a substantial heat sink against the DUT and preheats the DUT for about 1-2 seconds by forcing it to consume a predetermined amount of energy and (2) by "sliding" the lower "break point" (or pole) of the band-pass filter on the input of the measurement system (for example) from about 50 Hz to about 0.1 Hz in an interval of only 3 seconds or so. This combination of features enables a complete noise test to be performed in significantly less than 30 seconds.

The invention is pointed out with particularity in the appended claims. The above and further advantages of the invention will be apparent on reference to the following detailed description of an illustrative embodiment, when taken in conjunction with the accompanying drawing.

BRIEF DESCRIPTION OF THE DRAWING

In the drawing:

FIG. 1 is a block diagram of a system for measuring the low-frequency noise generated by a device under test;

FIG. 2 is an illustration of waveforms representing empirically determined warm-up characteristics of a representative device under test when exposed to open air;

DETAILED DESCRIPTION OF AN ILLUSTRATIVE EMBODIMENT

Figure 3:
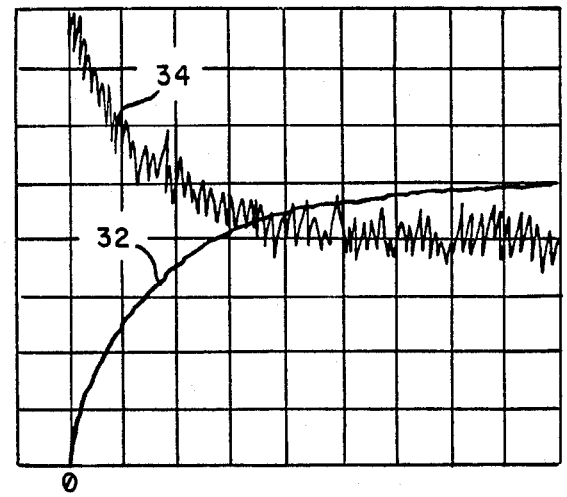
FIG. 3 is an illustration of waveforms representing empirically determined warm-up characteristics of the same device under test when placed in a closed box.

With reference to the drawing, FIG. 1 depicts, in a very general form, a system 10 for measuring the low-frequency noise generated by a DUT 12, within a passband of interest. The system comprises an input bandpass filter 14 and a conventional analyzer 16. The empirically obtained warm-up characteristic of the input offset voltage for an Analog Devices, Inc. Model AD544 operational amplifier exposed to open air is shown in FIG. 2 at 20. The corresponding output voltage 24 from filter 14, representing the noise voltage generated by the device under test 12, shows some extreme peak values 26, which are not at all a good representation of the actual noise voltage. Thus, for such a device left in open air, it can readily be seen that a measurement which is supposed to represent the noise voltage generated by the DUT may, in fact, be nothing more than a noisy measurement of the temperature variations in the ambient conditions.

Figure 4:
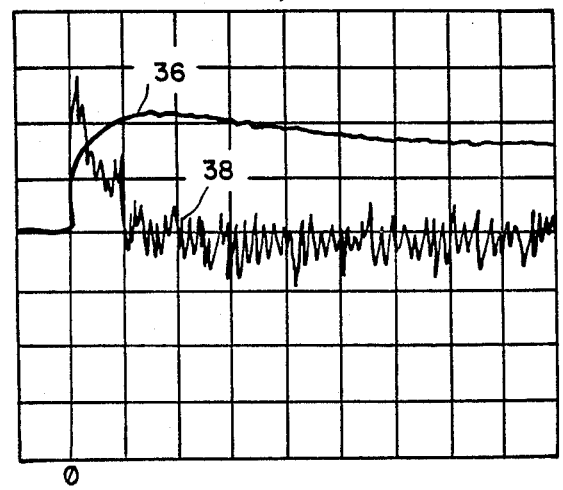
FIG. 4 is an illustration of waveforms representing empirically determined warm-up characteristics of the same device under test when biased to body temperature before being placed in a closed box.

When the same DUT is placed in a closed box, the input offset warm-up characteristic and filter output have been observed to be as shown, for example, at curves 32 and 34, respectively, in FIG. 3. The total offset change is a little bit more that it was in FIG. 2, but it settles out to a very stable point. When the measurement is made with the DUT not only in a closed box, but biased to body temperature before the test is begun, the input offset warm-up characteristic and filter output are as shown in FIG. 4, at curves 36 and 38, respectively.

Figure 5:
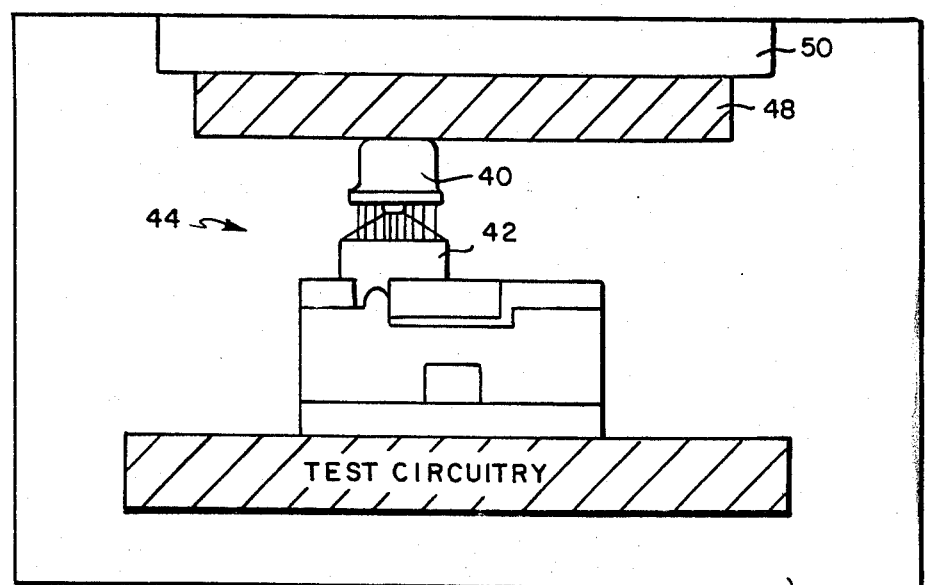
FIG. 5 is a pictorial illustration of the test socket structure used in the present invention.
Figure 6:
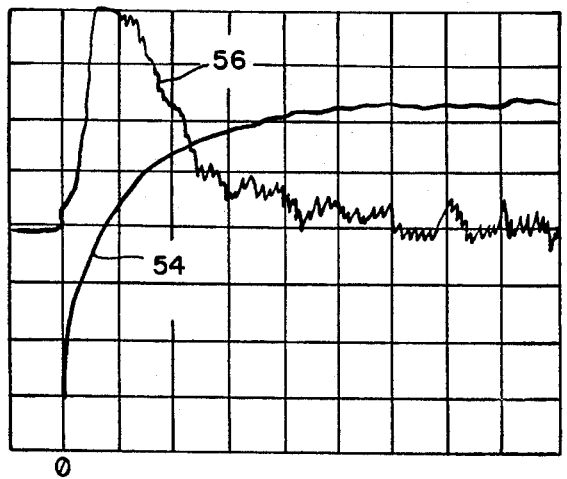
FIG. 6 is an illustration of waveforms representing empirically determined warm-up characteristics of the same device under test, when it is placed in the test socket of FIG. 5.

To make an accurate noise measurement, it is important that the temperature of the device under test be stabilized to better than 1/10 of a degree Celsius. One structure capable of accomplishing this stabilization is illustrated in FIG. 5. There, the DUT 40 is placed in a socket 42 in a test fixture 44 housed in a substantially closed box 46. A thick aluminum heat sink 48 (which is, e.g., at least ¼ inch thick) is brought into contact with the DUT. The aluminum heat sink 48 is mounted on one or more pieces of rubber foam or other resilient, insulating material 50 such that the closing of the lid of the box 46 forces the heat sink 48 against the DUT 40, with the rubber foam 50 urging heat sink 48 against the DUT 40. Typically, the case of the DUT is energized to about $-31V$, so the heat sink 48 must also be insulated electrically from the case or box 46. The rubber foam 50 serves this purpose, as well. As shown in FIG. 6, this arrangement can stabilize the DUT fairly quickly. There, curve 54 represents the input offset warm-up characteristic, while curve 56 represents the corresponding filter output. As shown, an accurate measurement can be made after about 20–30 seconds.

Figure 7:
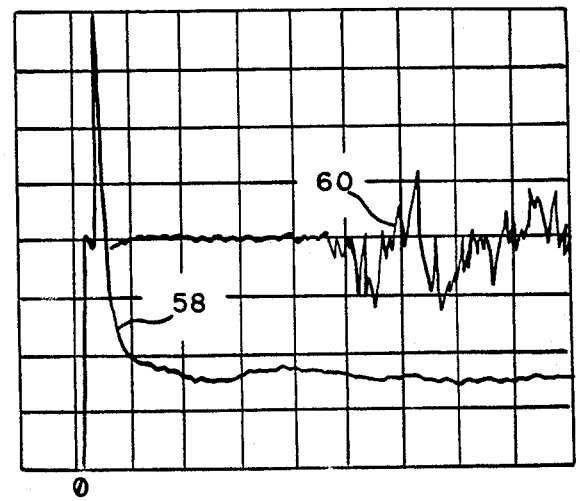
FIG. 7 is an illustration of waveforms representing empirically determined warm-up characteristics of the same device under test, when it is placed in the test socket of FIG. 5 and preheated for 1-2 seconds.

The use of the metal heat sink 48 keeps the temperature rise of the integrated circuit chip to about ¼ of what it was in free air. Some of this rise is the temperature gradient from the semiconductor material to the header in the package. Production of this gradient can be hastened by forcing the chip to dissipate more power than usual. For example, with a typical integrated circuit as the DUT, pre-heating may be accomplished by forcing the dissipation of about 350 mW of power for 1–2 seconds or so. Curve 58 in FIG. 7 shows the input offset warm-up drift characteristic this typically produces. As revealed in curve 60, the filter output, the DUT is thermally settled at about 12.5 seconds.

Moreover, the use of the pre-heat step together with the heat sink structure forces the DUT to settle thermally in a predetermined length of time. This removes the need for subjective determination as to when to start making the noise measurement. Central to obtaining this benefit is the ability to control the energy supplied to the DUT during the pre-heat operation.

Figure 9:
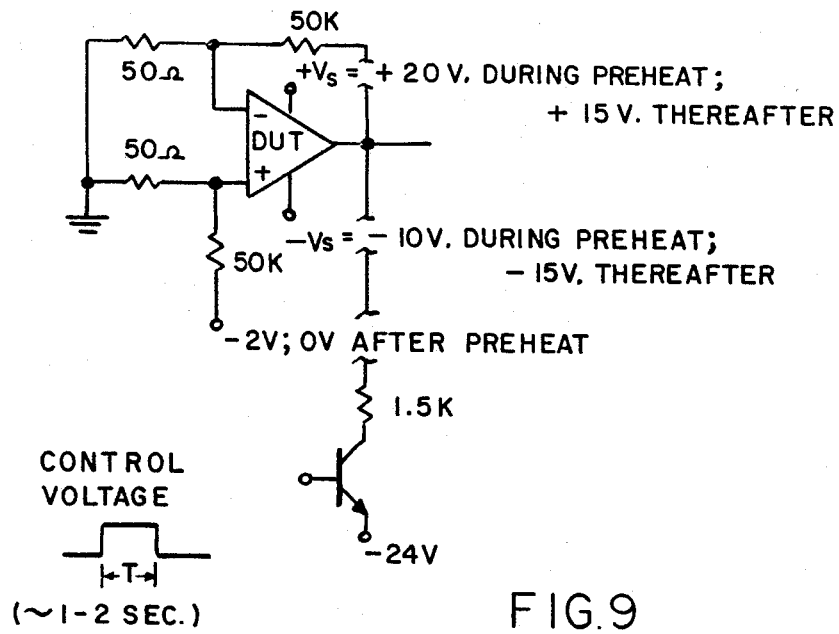
FIG. 9 is a schematic diagram of an exemplary circuit for preheating the device under test.

A suitable circuit for pre-heating the DUT is shown in FIG. 9. The circuit operates by varying the load and the time the load is driven. Because the operating point of the DUT is known (i.e., it is set by the pre-heat circuit), the energy consumed by the DUT can be controlled by varying the time the load is driven by the DUT. This approach has the advantage of yielding consistent results even when the DUT is changed. By contrast, if pre-heating is accomplished by the conventional approach of shorting the output of the DUT and an unused input, there is far less control, mostly because short circuit current can vary quite a lot even among devices of the same type.

Figure 8:
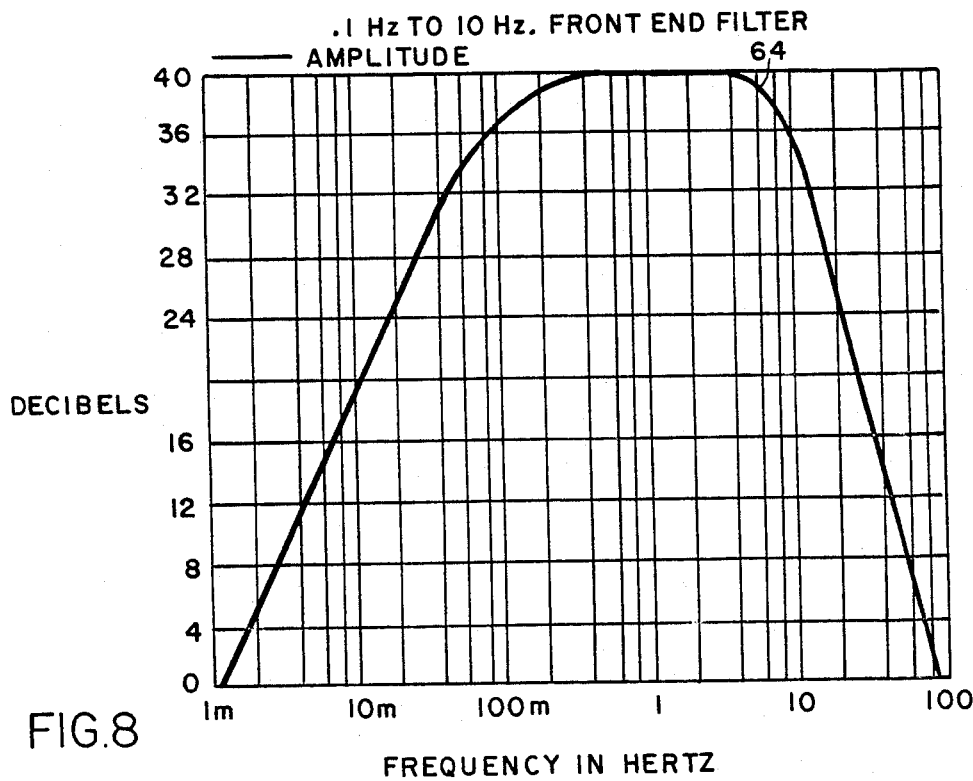
FIG. 8 is an illustration of a waveform showing the frequency response of the input filter used in the measurement system of the present invention.

Another factor influencing the speed with which a noise measurement can be obtained at low frequencies is the settling time of the input filter of the measurement system. In the discussion which follows, it is presumed that the user of the system desires to measure noise voltage generated by the DUT over the frequency range of about 0.1 Hz to 10 Hz. The input filter for the measurement system will have a noise equivalent bandwidth of about 10 Hz. The filter comprises a high-pass filter with a pole at 0.11 Hz and a low-pass filter with a pole at 9.13 Hz. The high-pass filter is a first order type of filter, to keep settling time to a minimum. The low-pass filter may be a two-pole Butterworth filter for maximum pass-band flatness. The components used in the filter should preferably be chosen for high stability, to keep the accuracy of the filtered noise signal within about one percent. The amplitude response of the filter is shown in curve 64 in FIG. 8.

Figure 10:
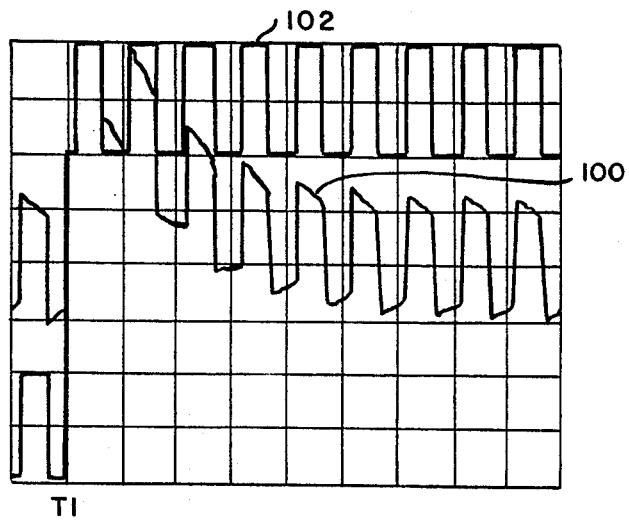
FIG. 10 is an illustration of waveforms showing a calibration signal applied to the input filter of FIG. 8 and the response of that filter to a step in the calibration signal.

The settling time of a 0.1 Hz high-pass filter is quite slow. With reference to FIG. 10, the response 100 of the high-pass filter in input filter 14, to a small step input signal (i.e., the step in pulse train 102 at time T1), is seen to be about 8 seconds. If the magnitude of the step is increased, such as to a couple orders of magnitude greater than the noise voltage, the settling time can easily be enlarged to 20-30 seconds. Much faster settling can be accomplished by switching the pole of the high-pass filter to an initial frequency much greater than the finally desired 0.11 Hz. This results in a much shorter settling time. After a second or two, the filter can be switched back to its desired 0.11 Hz pole location. Unfortunately, the measurement cannot be taken for another several (e.g., 8) seconds.

Figure 11:
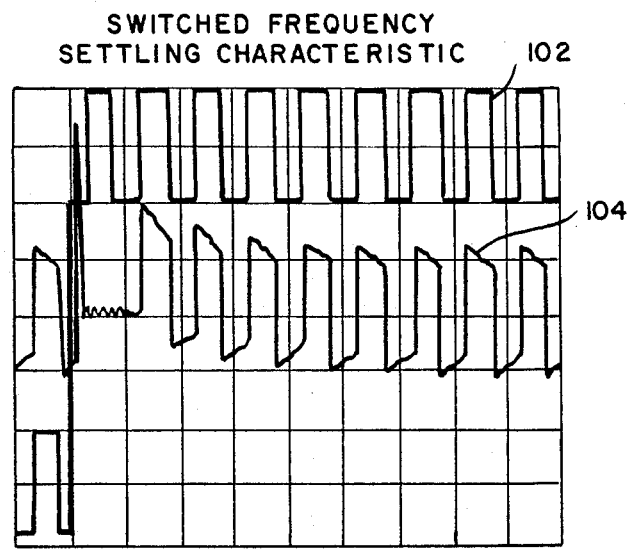
FIG. 11 is an illustration of waveforms showing a calibration signal applied to the input filter and the response of that filter to a step in the calibration signal when the high-pass pole of that filter is switched from an initial, relatively high frequency to a final, lower frequency.

During the time that the filter has had its high-pass pole moved up in frequency, the noise voltage appears mostly across the high-pass filter's capacitor. The instant that the filter is switched to its target response, however, the value on the capacitor will not be the average value of the noise voltage. Consequently, the filter will then have to take another several seconds to settle, before an accurate voltage measurement can be made. This may be seen in curve 104 of FIG. 11.

Figure 12:
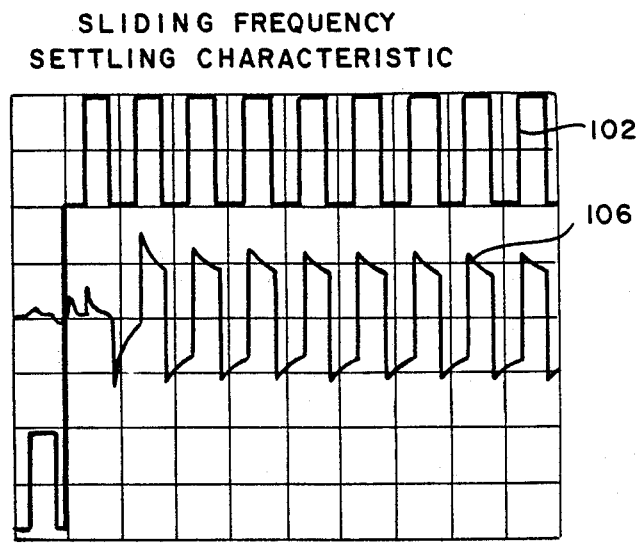
FIG. 12 is an illustration of waveforms showing a calibration signal applied to the input filter and the response of that filter to a step in the calibration signal when the high-pass pole of that filter is slid smoothly from an initial, relatively high frequency to a final, lower frequency.

That problem is overcome in the present invention by smoothly "sliding" the high-pass filter pole from its initial value of about 50 Hz to its final value of about 0.11 Hz, over an interval of about 3 seconds. The resulting settling characteristic responsive to a step input with some noise voltage on it is shown at waveform 106 in FIG. 12. Because the filter frequency is moved at a relatively slow rate, the envelope of the noise voltage moves toward its final value without any appreciable DC component to settle out. This approach guarantees the ability to measure a noise voltage within about 3 seconds after an input transient occurs.

Figure 13:
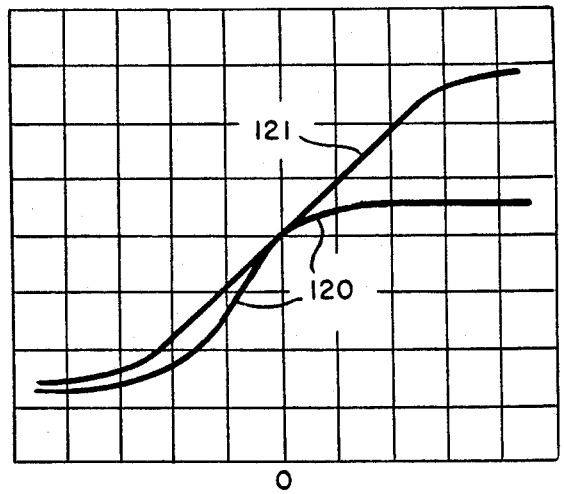
FIG. 13 is an illustration of the non-linearized and linearized V-I characteristics of a FET used to as a voltage-controlled resistor to slide the frequency response of the filter as in FIG. 12.
Figure 14:
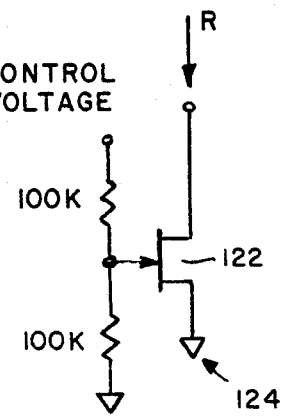
FIG. 14 is a schematic diagram of the circuit for producing the non-linearized V-I characteristic of FIG. 12.
Figure 15:
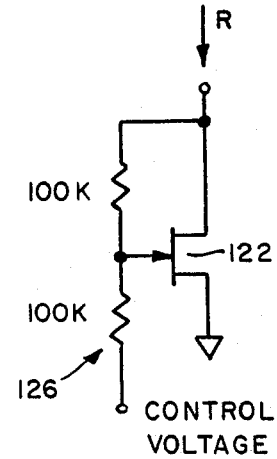
FIG. 15 is a schematic diagram of the circuit for producing the linearized V-I characteristic of FIG. 12.

The frequency of the pole of the high-pass filter is controlled via a voltage-controlled resistor, such as a JFET. However, as shown in FIG. 13, the voltage versus current characteristic 120 of a standard FET 122 (connected as shown at 124 in FIG. 14) is not very linear. If this characteristic were used to control a filter frequency, the linearity would create a DC voltage which would aggravate the settling characteristics of the high-pass filter. However if one half of the drain voltage is fed back to the gate of the FET, as in circuit 126 of FIG. 15, the corresponding V-I characteristic 128 (FIG. 13) becomes very linear at low voltages. It also becomes symetric in the areas where it is not linear. This characteristic keeps the DC voltage on the capacitor to a minimum while the FET 122 is turned on. This linearized FET resistance characteristic 128 is used to control the settling characteristics of the high-pass filter.

Figure 16:
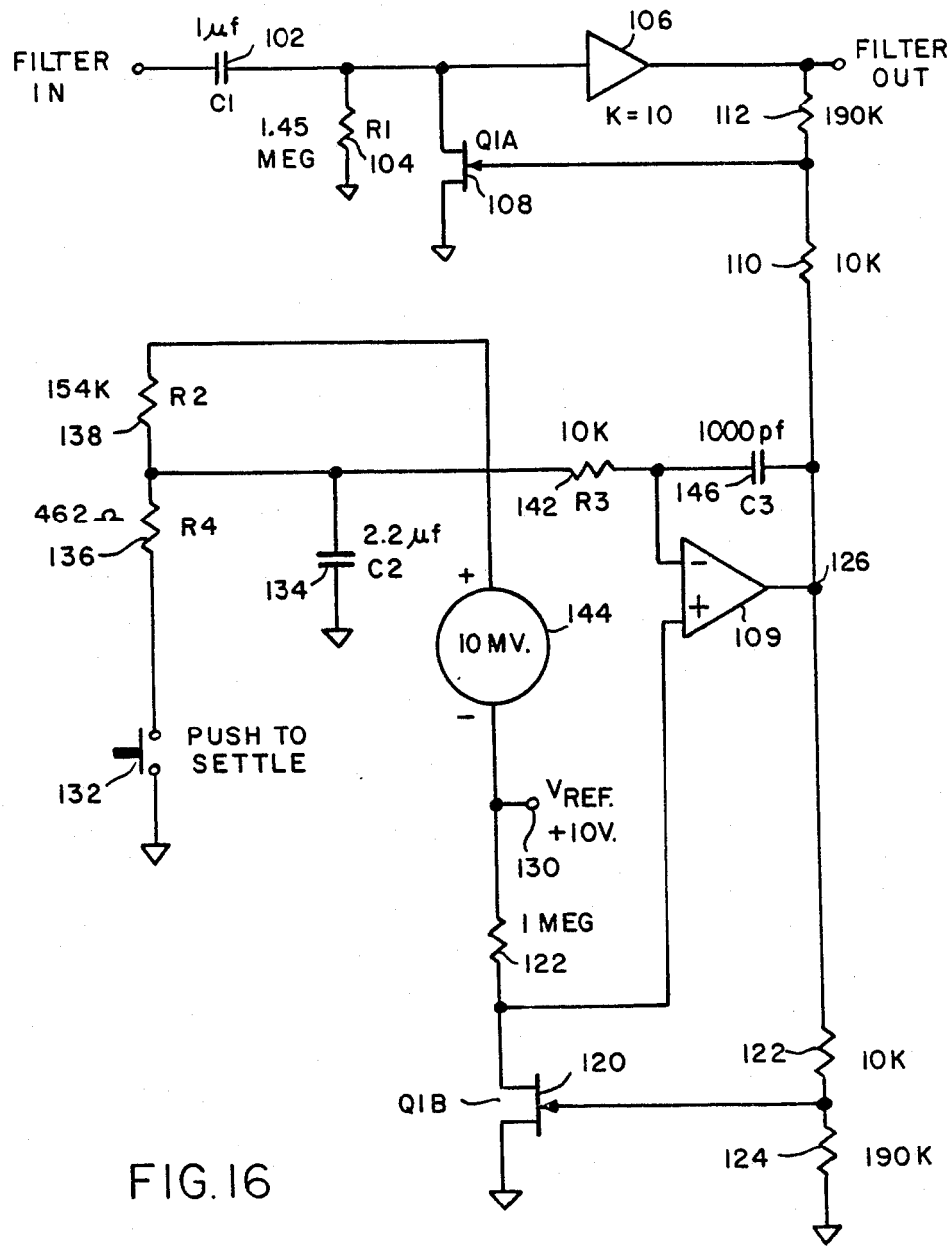
FIG. 16 is a schematic circuit diagram of the filter settling circuit of the present invention.

The basic filter settling circuit is shown in FIG. 16. Capacitor 102, resistor 104 and FET 108 comprise the basic high-pass filter; they are followed by a buffer amplifier 106, which has a gain of, for example, 10. FET 108 is the transistor which is used as a voltage-controlled resistor to slide the frequency of the pole of the high-pass filter. The d.c. operating point of FET 108 is set by driving its gate from the output of amplifier 109 through a voltage divider comprising the resistors 110 and 112. That voltage divider divides the output of amplifier 106 by a factor of 20. This forces FET 108 to have a linearized resistor characteristic. The gate of a second JFET 120 is driven by a similar voltage divider comprising resistors 122 and 124. The dividers 110, 112 and 122, 124 are driven in parallel, at the common node 126, forcing the gates of transistors 120 and 108 to be at the same DC voltage.

FET 120 is used in a voltage divider network comprising the drain-source resistance of FET 120 and a series resistance 122 of 1M ohms in series therewith. The effect of this latter divider is, in essence, to sense the resistance of FET 108 by creating a twin thereof. A ten volt reference supply is connected at point 130 as the supply for the resistive divider 122, 120. When the normally open switch 132 is closed, the charge on capacitor 134 is drained through resistor 136. Thereafter, when switch 132 is opened, capacitor 134 is charged at an exponential rate through resistor 138. Operational amplifier 109 has its inverting input connected to capacitor 134, through resistor 142. Amplifier 109 thus servos the drain voltage on FET 120 to match the voltage on capacitor 134. After about seven time constants of capacitor 134 and resistor 138, the 10 mV source 144, which is connected between terminal 130 and the end of resistor 138 opposite capacitor 134, forces the output of operational amplifier 109 to "ramp" down to about −12 V. Resistor 142 and capacitor 146 cause amplifier 140 to act as an intergrator, and they control the rate of integration to prevent dumping of charge into capacitor 102 through FET 108.

When switch 132 is turned on, resistors 136 and 138 further form a voltage divider which sets the resistance of FETs 108 and 120 to about 3K ohms. This alleviates any drive problems to the DUT which might occur if FET 108 were turned on fully.

Figure 17:
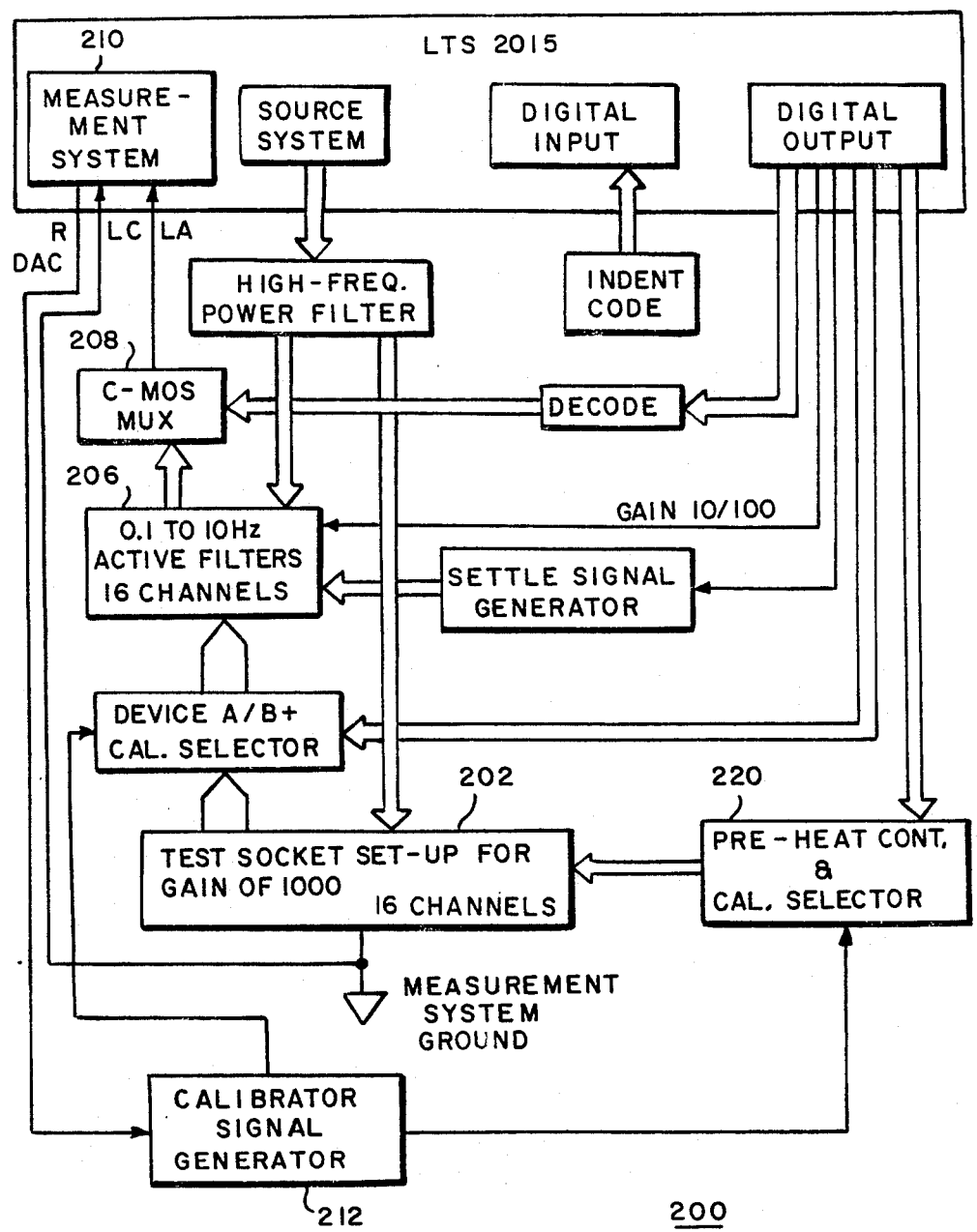
FIG. 17 is a block diagram of a production-oriented test system according to the present invention.

A block diagram for a production-oriented test system 200 using the present invention is shown in FIG. 17. The test system may, for example, include a number (such as 16) test sockets 202 for receiving a group of components to be tested. The sockets are, preferably, equipped with aluminum heat sinks, to keep temperature variations of each DUT to a minimum. Each of the test socket fixtures will, preferably, be connected to a very low noise amplifier with a known, uniform gain of, for example, 1000. Included with each test socket is circuitry, not shown, to allow pre-heating each device under test. There may also be circuitry for forcing a calibration signal through each device, to test functionality. Following each test socket is one of the fast settling filters 206 of the present invention. The filters 206 are followed by a CMOS multiplexor (or MUX) 208, which is used to scan the outputs of the filters. The output of MUX 208 is connected to the input of the measurement system 210. The measurement system may, for example, be an Analog Devices model LTS-2015 computer test system.

Figure 18:
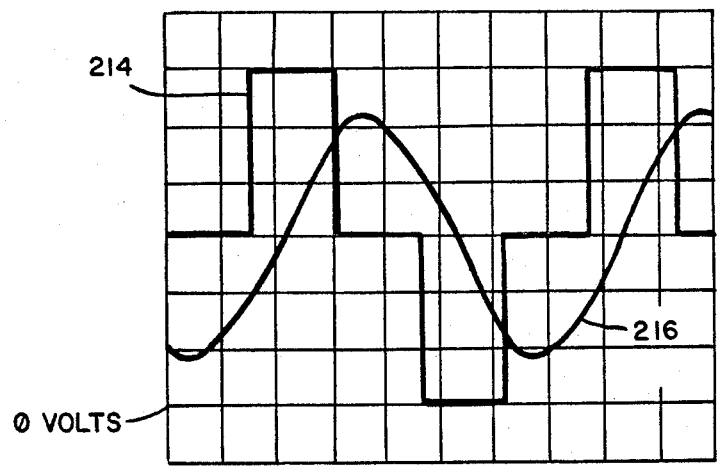
FIG. 18 is an illustration of a calibrator signal waveform for use with the present invention, and the corresponding output of the input filter.

Optionally, a calibrator signal generator 212 may be included. FIG. 18 shows, at 214, the waveform for the voltage output of the calibrator signal generator 212. The negative peak of the calibrator voltage is at 0 volts, so the output has a DC voltage component. This enables the system to insure that the high-pass filters 206 are working properly. The calibrator voltage may, for example, have a frequency of 8 Hz, and is very rich in odd harmonics. Thus, the output of each of filters 206, when presented with the calibrator signal as input, is very dependent on the low-pass characteristics of the filter. This helps assure good calibration both of the gain of the filter and of its frequency response. Waveform 216 shows the output from the filter when presented with the calibrator signal 214.

The calibrator voltage also is used to check the functionality of the devices under test. This is done by applying an attenuated version of the calibrator signal to the non-inverting inputs of the devices under test, via the calibration input selector circuit 220. A non-functional amplifier will not provide an output signal from this input. This eliminates the possibility of passing as approved a device under test which has a very low noise output if, in fact, it is non-functional.

Figure 19:
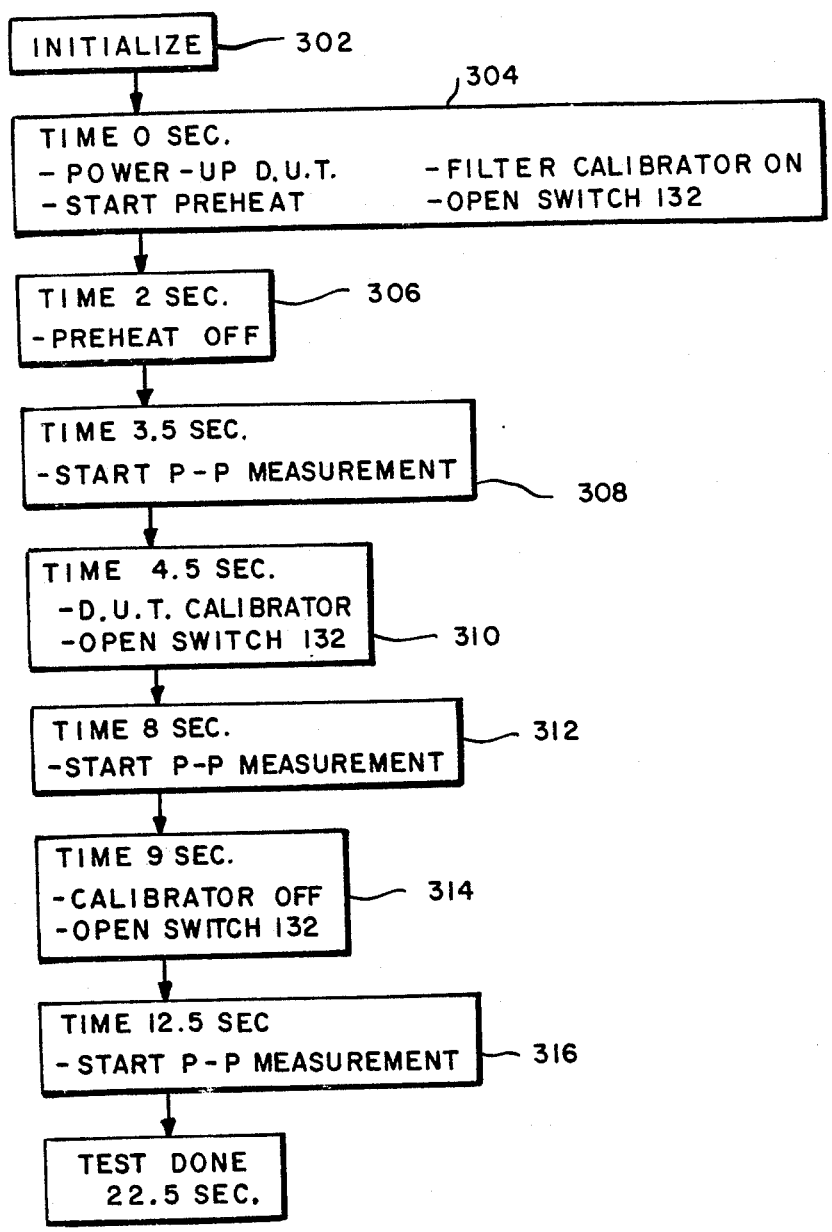
FIG. 19 is a flow chart of the test method of the present invention.

An exemplary testing routine is illustrated in FIG. 19. The steps of the testing routine illustrated there are as follows: First, the test system is initialized (step 302). Next, the DUT is energized, preheat operation is started, the calibrator signal generator is turned on and the filter is allowed to settle (step 304). At 2 seconds into the test, the preheat operation is terminated (step 306). Then 3.5 seconds into the test, peak-to-peak voltage measurements are begun (step 308) to check the functionality of the filter. At 4.5 seconds, the calibrator signal is applied to the DUT and the switch 132 is opened (step 310). At 8 seconds, peak-to-peak measurements are commenced (step 312), checking the functionality of the DUT. At 9 seconds, the calibrator 212 is turned off, and the filter is settled (i.e., switch 132 is opened) (step 314). Peak-to-peak noise voltage measurements are begun at 12.5 seconds (step 316).

A sample measurement is made on each filter once every 10 mS. After each reading, two memory locations associated with the filter are checked to see if the reading just made is a new maximum or a new minimum reading for that filter. If it is a new peak, the value is saved in the appropriate memory location.

This routine takes a large number (e.g., 1000) samples on each filter and saves only the minimum and maximum readings.

Empirically it has been determined that only about 22.5 seconds are required to completely test a single device. Dual devices may be tested in about 40.5 seconds. These times are not dependent on the thermal characteristics of the device under test or on long settling times in the filter. Measurement time is kept to a minimum and the system does not have to make complex determinations as to when responses have settled to a point where a measurement can be made reliably.

Having thus described an exemplary embodiment of the invention, it will be apparent that various alterations, modifications and improvements will readily occur to those skilled in the art. Such obvious alterations, modifications and improvements, though not expressly described above, are nevertheless intended to be implied and are within the spirit and scope of the invention. Accordingly, the foregoing discussion is intended to be illustrative only, and not limiting; the invention is limited and defined only by the following claims and equivalents thereto.

What is claimed is:

1. Apparatus for providing the low frequency noise signal of an energized device under test, comprising:
    a. a housing containing a socket for receiving the device under test;
    b. within said housing, a heat sink adapted to be brought into contact with the device under test;
    c. means for electrically preheating the device under test to stabilize its input offset voltage thermally;
    d. a high-pass filter connected to receive a voltage output from the device under test for output to a noise measurement apparatus;
    e. the frequency response of the high-pass filter having one dominant pole;
    f. means for smoothly sliding the frequency of said dominant pole from a first, higher frequency to a second, lower frequency over a relatively short interval; to facilitate settling of said filter.

2. The apparatus of claim 1 wherein the means for preheating the device under test is adapted to cause an electrical current to flow through the device.

3. The apparatus of claim 1 wherein said means for preheating the device under test places an electrical load across the device.

4. The apparatus of claim 3 wherein the energy consumed by the device under test is controlled by varying at least one of the load and the time the load is driven.

5. The apparatus of claim 1 further comprising a low pass filter connected in series with said high pass filter between the output of the device under test and the measurement apparatus.

6. The apparatus of claim 5 wherein said low pass filter is a two-pole Butterworth filter.

7. The apparatus of claim 5 or claim 6 wherein said low pass filter has a pole near 10 Hz.

8. The apparatus of claim 1 or claim 5 wherein said first, higher frequency is about 50 Hz and said second, lower frequency is about 0.1 Hz.

9. The apparatus of claim 1 wherein the high pass filter further comprises a voltage controlled resistor whose resistance is established by a control voltage, the frequency of the dominant pole being established in part by said resistor, and means for providing a smoothly variable control voltage for application to the voltage controlled resistor.

10. The apparatus of claim 9 wherein the voltage controlled resistor is a JFET.

11. A method for performing a low frequency noise measurement on a device under test comprising the steps of:
    (a) placing the device under test in contact with a heat sink;
    (b) electrically energizing the device under test;
    (c) electrically heating the device under test by passing a current therethrough;
    (d) passing the output of the device under test through a high-pass filter having one dominant pole;
    (e) sliding the frequency of said dominant pole from a first, higher frequency to a second, lower frequency over a relatively short interval, to facilitate settling of said filter; and
at the output of the high-pass filter, measuring the filtered noise output of the device under test in the absence of an applied input signal.

12. A system for measuring the low frequency noise of a plurality of devices under test (DUT), comprising:
    (a) a plurality of test sockets for receiving DUTs;
    (b) a heat sink for placement in contact with a DUT placed in the socket;
    (c) means for electrically preheating each DUT;
    (d) associated with each socket, a high pass filter connectable via the socket to the output of the DUT placed therein, said filter having one dominant pole and means for smoothly sliding the frequency of said dominant pole from a first, higher frequency to a second, lower frequency over a relatively short interval, to facilitate settling of said filter;

(e) a multiplexer having a single output and a plurality of inputs, each input being connected to an output of one of said filters;

(f) a measurement system connected to the output of the multiplexer for measuring the noise generated by the DUT whose output is connected to the multiplexer output.

* * * * *